(12) United States Patent
Kijima (10) Patent No.: US 7,847,372 B2
(45) Date of Patent: Dec. 7, 2010

(54) FERROELECTRIC CAPACITOR, METHOD OF MANUFACTURING FERROELECTRIC CAPACITOR, AND FERROELECTRIC MEMORY

(75) Inventor: Takeshi Kijima, Matsumoto (JP)

(73) Assignee: Seiko Epson Corporation (JP)

( * ) Notice: Subject to any disclaimer, the term of this patent is extended or adjusted under 35 U.S.C. 154(b) by 299 days.

(21) Appl. No.: 11/805,890

(22) Filed: May 24, 2007

(65) Prior Publication Data

US 2007/0278545 A1    Dec. 6, 2007

(30) Foreign Application Priority Data

May 31, 2006    (JP) .............. 2006-151313

(51) Int. Cl.
 *H01L 29/00*    (2006.01)
(52) U.S. Cl. .............. 257/533; 257/535; 257/E27.048; 257/E21.664
(58) Field of Classification Search .................. 257/533, 257/535, E27.048, E21.664
See application file for complete search history.

(56) References Cited

U.S. PATENT DOCUMENTS

| | | | |
|---|---|---|---|
| 6,855,974 B2 | 2/2005 | Matsuura et al. | |
| 7,247,504 B2 | 7/2007 | Matsuura et al. | |
| 7,338,814 B2 | 3/2008 | Tatsunari | |
| 7,368,774 B2 * | 5/2008 | Hamada et al. | 257/295 |
| 2004/0033672 A1 | 2/2004 | Matsuura et al. | |
| 2004/0135183 A1 | 7/2004 | Matsuura et al. | |
| 2005/0161717 A1 | 7/2005 | Nakamura et al. | |
| 2005/0236654 A1 | 10/2005 | Kijima et al. | |
| 2007/0054038 A1 * | 3/2007 | Kijima et al. | 427/126.1 |
| 2008/0160645 A1 | 7/2008 | Nakamura et al. | |

FOREIGN PATENT DOCUMENTS

| | | |
|---|---|---|
| EP | 1 271 658 | 1/2003 |
| EP | 1 589 566 | 10/2005 |
| JP | 2001-139313 | 5/2001 |
| JP | 2004/214569 | 7/2004 |
| JP | 2005-311294 | 11/2005 |
| JP | 2005-333105 | 12/2005 |
| JP | 2006-024748 | 1/2006 |
| KR | 2005-0077749 | 8/2005 |

* cited by examiner

*Primary Examiner*—Ngan Ngo
(74) *Attorney, Agent, or Firm*—Harness, Dickey & Pierce, P.L.C.

(57) ABSTRACT

A ferroelectric capacitor including: a substrate; a first electrode formed above the substrate; a first ferroelectric layer formed above the first electrode and including a complex oxide shown by $Pb(Zr,Ti)O_3$; a second ferroelectric layer formed above the first ferroelectric layer and including a complex oxide shown by $Pb(Zr,Ti)_{1-x}Nb_xO_3$; and a second electrode formed above the second ferroelectric layer.

10 Claims, 12 Drawing Sheets

LEAD OCTYLATE

NIOBIUM OCTYLATE

NIOBIUM LEAD OCTYLATE

FIG.4A

DIMETHYL SUCCINATE

DIETHYL SUCCINATE

FIG.4B

LINEAR SATURATED POLYCARBOXYLIC ACID

DIBUTYL OXALATE

DIMETHYL MALONATE

DIMETHYL ADIPATE

TRIBUTYL CITRATE

TRIETHYL 1,1,2-ETHANETRICARBOXYLATE

TETRAETHYL 1,1,2,2-ETHANETETRACARBOXYLATE

FIG.4C

LINEAR UNSATURATED POLYCARBOXYLIC ACID

DIMETHYL MALEATE

DIETHYL FUMARATE

TRANS-ACONITIC ACID

FERROELECTRIC CAPACITOR, METHOD OF MANUFACTURING FERROELECTRIC CAPACITOR, AND FERROELECTRIC MEMORY

Japanese Patent Application No. 2006-151313, filed on May 31, 2006, is hereby incorporated by reference in its entirety.

BACKGROUND OF THE INVENTION

The present invention relates to a ferroelectric capacitor using a Pb-based perovskite oxide, a method of manufacturing the ferroelectric capacitor, and a ferroelectric memory using the ferroelectric capacitor.

A Pb-based perovskite oxide such as PZT $(Pb(Zr,Ti)O_3)$ exhibits excellent ferroelectric characteristics or piezoelectric characteristics. Therefore, the Pb-based perovskite oxide has attracted attention as a ferroelectric film for a ferroelectric capacitor, for example (see JP-A-2001-139313).

SUMMARY

According to a first aspect of the invention, there is provided a ferroelectric capacitor comprising:
 a substrate;
 a first electrode formed above the substrate;
 a first ferroelectric layer formed above the first electrode and including a complex oxide shown by $Pb(Zr,Ti)O_3$;
 a second ferroelectric layer formed above the first ferroelectric layer and including a complex oxide shown by $Pb(Zr,Ti)_{1-x}Nb_xO_3$; and
 a second electrode formed above the second ferroelectric layer.

According to a second aspect of the invention, there is provided a method of manufacturing a ferroelectric capacitor comprising:
 forming a first electrode above a substrate;
 forming a first ferroelectric layer including a complex oxide shown by $Pb(Zr,Ti)O_3$ above the first electrode by a chemical vapor deposition (CVD) method;
 forming a second ferroelectric layer including a complex oxide shown by $Pb(Zr,Ti)_{1-x}Nb_xO_3$ above the first ferroelectric layer by a solution method; and
 forming a second electrode above the second ferroelectric layer.

According to a third aspect of the invention, there is provided a ferroelectric memory comprising the above-described ferroelectric capacitor.

DETAILED DESCRIPTION OF THE EMBODIMENT

The invention may provide a ferroelectric capacitor exhibiting excellent reliability and a method of manufacturing the same.

The invention may also provide a ferroelectric memory including the above ferroelectric capacitor.

According to one embodiment of the invention, there is provided a ferroelectric capacitor comprising:
 a substrate;
 a first electrode formed above the substrate;
 a first ferroelectric layer formed above the first electrode and including a complex oxide shown by $Pb(Zr,Ti)O_3$;
 a second ferroelectric layer formed above the first ferroelectric layer and including a complex oxide shown by $Pb(Zr,Ti)_{1-x}Nb_xO_3$; and
 a second electrode formed above the second ferroelectric layer.

According to the ferroelectric capacitor of this embodiment, by forming a specific second ferroelectric layer above the first ferroelectric layer, occurrence of crystal defects in the first ferroelectric layer can be prevented, whereby the ferroelectric capacitor exhibits excellent ferroelectric characteristics.

In the ferroelectric capacitor according to this embodiment, the complex oxide of the second ferroelectric layer may have a value of x in a range of $0.1 \leq x \leq 0.3$.

In the ferroelectric capacitor according to this embodiment, the second ferroelectric layer may include 0.5 mol % or more of Si or Si and Ge.

In the ferroelectric capacitor according to this embodiment, the thickness of the second ferroelectric layer may be smaller than the thickness of the first ferroelectric layer.

In the ferroelectric capacitor according to this embodiment, the second electrode may include an iridium oxide layer formed on the second ferroelectric layer and an iridium layer formed on the iridium oxide layer.

In the ferroelectric capacitor according to this embodiment, the first electrode may include at least one layer selected from a platinum layer, an iridium layer, and an iridium oxide layer.

According to one embodiment of the invention, there is provided a method of manufacturing a ferroelectric capacitor comprising:
 forming a first electrode above a substrate;
 forming a first ferroelectric layer including a complex oxide shown by $Pb(Zr,Ti)O_3$ above the first electrode by a chemical vapor deposition (CVD) method;
 forming a second ferroelectric layer including a complex oxide shown by $Pb(Zr,Ti)_{1-x}Nb_xO_3$ above the first ferroelectric layer by a solution method; and
 forming a second electrode above the second ferroelectric layer.

The manufacturing method according to this embodiment prevents occurrence of crystal defects in the first ferroelectric layer by forming a specific second ferroelectric layer above the first ferroelectric layer, whereby a ferroelectric capacitor exhibiting excellent ferroelectric characteristics can be manufactured.

In the method of manufacturing a ferroelectric capacitor according to this embodiment, the first ferroelectric layer may be formed by a metal-organic chemical vapor deposition (MOCVD) method.

According to one embodiment of the invention, there is provided a ferroelectric memory comprising the above-described ferroelectric capacitor.

Some embodiments of the invention will be described in detail below.

1. Ferroelectric Capacitor

Figure 1:
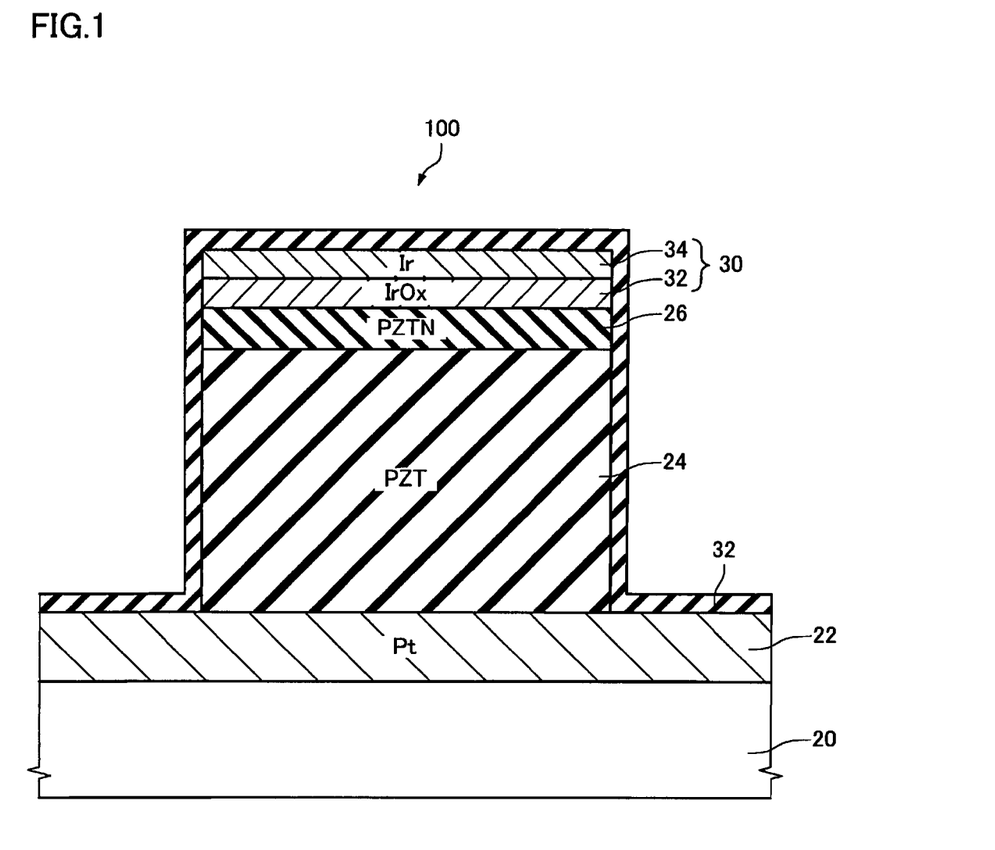
FIG. 1 is a cross-sectional view showing a ferroelectric capacitor according to one embodiment of the invention.

FIG. 1 is a cross-sectional view schematically showing a ferroelectric capacitor 100 according to one embodiment of the invention.

The ferroelectric capacitor 100 according to this embodiment includes a substrate 20, a first electrode 22 formed above the substrate 20, a first ferroelectric layer 24 formed above the first electrode 22 and including a complex oxide shown by $Pb(Zr,Ti)O_3$, a second ferroelectric layer 26 formed above the first ferroelectric layer 24 and including a complex oxide shown by $Pb(Zr,Ti)_{1-x}Nb_xO_3$, and a second electrode 30 formed above the second ferroelectric layer 26.

As the substrate 20, various substrates may be used depending on the type and application of the ferroelectric capacitor 100 according to this embodiment. For example, when using the ferroelectric capacitor 100 as a capacitor of a ferroelectric memory, a silicon substrate on which elements such as transistors are formed may be used as the substrate 20.

In the example shown in FIG. 1, the first electrode 22 is formed on the substrate 20. The first electrode 22 includes a conductive oxide film formed of a platinum metal such as platinum or iridium, iridium oxide, or the like. The first electrode 22 may be a single layer of the above conductive layer, or may be formed by stacking two or more of the above conductive layers.

The thicknesses of the first ferroelectric layer 24 and the second ferroelectric layer 26 are appropriately selected depending on the ferroelectric memory to which this embodiment is applied. The first ferroelectric layer 24 mainly forms a ferroelectric film of the capacitor 100. The second ferroelectric layer 26 has a function of suppressing deterioration in the characteristics of the first ferroelectric layer 24. Therefore, the thickness of the second ferroelectric layer 26 is set so that the second ferroelectric layer 26 at least covers the surface of the first ferroelectric layer 24 and absorbs a heterophase formed on the outermost surface of the first ferroelectric layer 24. In the example of the capacitor 100 shown in FIG. 1, the thickness of the second ferroelectric layer 26 may be set at 100 to 1000 nm, for example.

In this embodiment, the first ferroelectric layer 24 may be $Pb(Zr_{1-y}Ti_y)O_3$ (PZT). y may be in the range of $3.5 \leq y \leq 6.5$.

The second ferroelectric layer 26 may be $Pb(Zr,Ti)_{1-x}Nb_xO_3$ (PZTN) in which the Ti site is doped with Nb. In this case, the second ferroelectric layer 26 may include Nb in the range of $0.1 \leq x \leq 0.3$. The ratio (Zr/Ti) of Zr to Ti may be 0.2 to 0.8. The second ferroelectric layer 26 is described below in detail.

Nb has an atomic size approximately equal to that of Ti (i.e. Nb and Ti have similar ionic radii and have the same atomic radius) and has an atomic weight twice the atomic weight of Ti. Therefore, Nb is not easily released from a lattice even if a collision occurs between atoms due to lattice vibration. Since Nb is stable at a valence of +5, the valence of Pb can be compensated for by $Nb^{5+}$ even if Pb is released. Moreover, even if Pb is released during crystallization, it is easier for Nb with a small atomic size to enter the lattice than for O with a large atomic size to be released.

Since $Nb^{4+}$ also exists, Nb can replace $Ti^{4+}$. In addition, it is considered that Pb is not easily released due to very strong covalent bonding properties of Nb (H. Miyazawa, E. Natori, S. Miyashita; Jpn. J. Appl. Phys. 39 (2000) 5679).

Since the second ferroelectric layer 26 is formed of PZTN and includes a specific amount of Nb, the second ferroelectric layer 26 exhibits excellent composition controllability due to the absence of the adverse effects of a Pb deficiency. As a result, PZTN exhibits excellent hysteresis characteristics, leakage characteristics, reduction resistance, insulating properties, and the like in comparison with general PZT.

Nb has been doped into PZT mainly in the Zr-rich rhombohedral region. However, the amount of doping is as small as about 0.2 to 0.025 mol % (J. Am. Ceram. Soc, 84 (2001) 902; Phys. Rev. Let, 83 (1999) 1347). This is because the crystallization temperature is increased when adding a large amount of Nb (e.g. the crystallization temperature is increased to 800° C. or more when adding Nb in an amount of 10 mol %).

Figure 2:
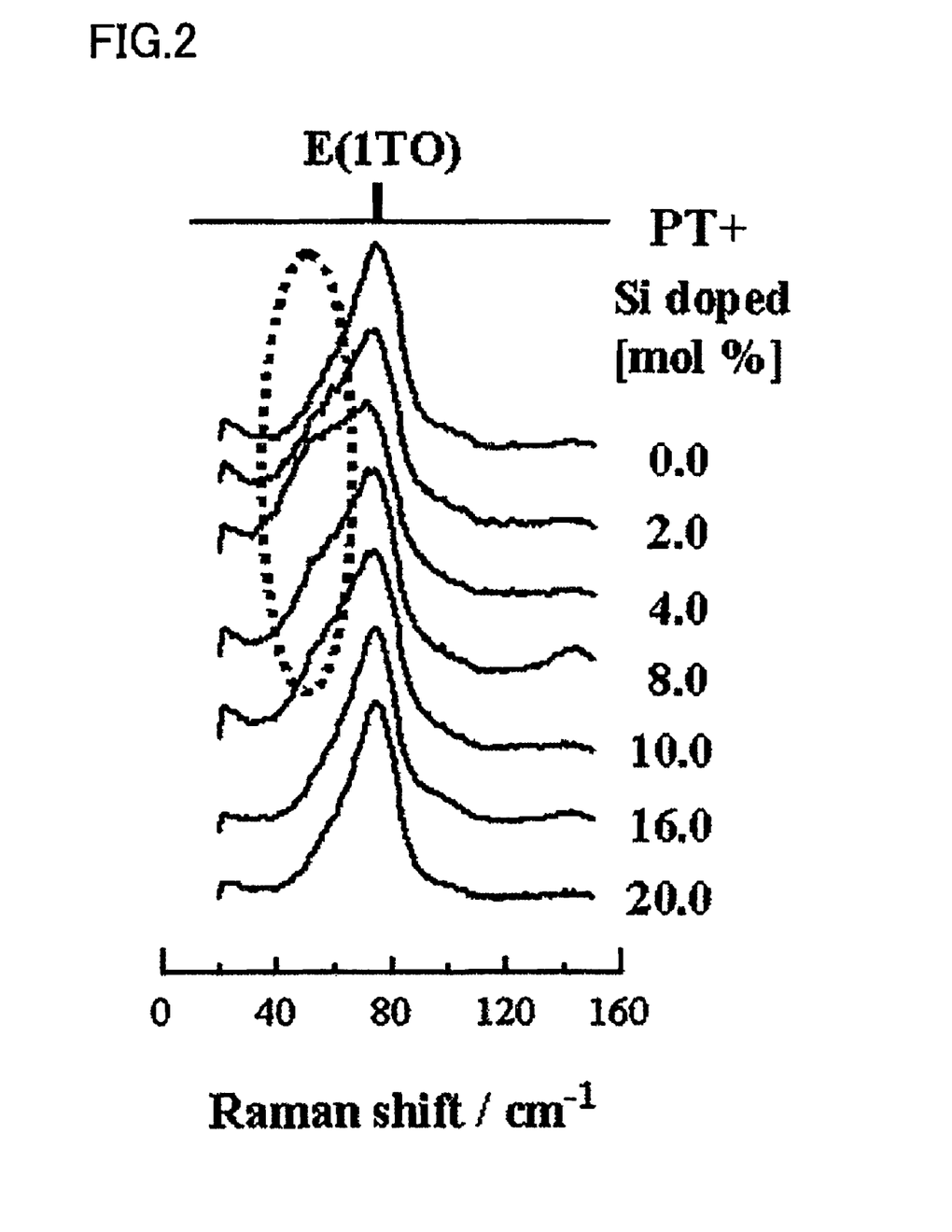
FIG. 2 shows a change in Raman vibration mode of an A-site ion when adding Si to lead titanate in one embodiment of the invention.

Therefore, it is preferable to add a $PbSiO_3$ silicate to a precursor composition of the second ferroelectric layer 26 in an amount of 0.5 to 10 mol %, for example. This reduces the crystallization energy of PZTN. Specifically, when using PZTN as the material for the ferroelectric layer, the crystallization temperature of PZTN can be reduced by adding a $PbSiO_3$ silicate together with Nb. A silicate and a germanate may be used in combination instead of using only a silicate. The inventor of the invention has confirmed that silicon functions as a sintering agent and then forms part of the crystal as the A-site ion (see FIG. 2). As shown in FIG. 2, when adding silicon to lead titanate, the Raman vibration mode E (ITO) of the A-site ion changed. The Raman vibration mode changed when the amount of silicon added was 8 mol % or less. Therefore, it was confirmed that silicon exists in the A site of the perovskite when adding a small amount of silicon.

As described above, the ferroelectric shown by $Pb(Zr,Ti,Nb)O_3$ (PZTN) according to this embodiment may preferably include 0.5 mol % or more of Si or Si and Ge, and still more preferably 0.5 to 10 mol % of Si or Si and Ge.

In this embodiment, the second electrode layer 30 is formed on the second ferroelectric layer 26. The second electrode 30 includes an oxide electrode 32 formed on the ferroelectric layer 26 and a metal electrode 34 formed on the oxide electrode 32. The oxide electrode 32 is formed of iridium oxide or the like, and the metal electrode 34 is formed of iridium or the like. Oxygen deficiencies in the second ferroelectric layer 26 can be more reliably reduced by forming the oxide electrode 32 in comparison with the case of directly forming the metal electrode on the second ferroelectric layer 26. This is because oxygen in iridium oxide prevents oxygen in PZTN forming the second ferroelectric layer 26 from diffusing into the electrode. Moreover, the conductivity of the second electrode 30 can be increased by forming the metal electrode 34. In addition, since the metal electrode 34 does not have a significant columnar structure when using iridium as the material for the metal electrode 34 in comparison with the case of using platinum or the like, a problem can be prevented in which a gas (e.g. reducing gas) which adversely affects the ferroelectric layers 26 and 24 from entering through the metal electrode 34. In this embodiment, the second electrode 30 has a stacked structure of the oxide electrode 32 and the metal electrode 34. Note that the second electrode 30 may have a single-layer structure formed of a conductive complex oxide layer such as iridium oxide or a metal layer such as iridium.

In this embodiment, the ferroelectric capacitor 100 may optionally include a protective layer 30. The protective layer 30 includes an insulating film formed of silicon oxide, silicon nitride, alumina, or the like. The protective layer 30 has a function of preventing deterioration of the first ferroelectric layer 24 and the second ferroelectric layer 26 caused by a reducing gas (e.g. hydrogen).

Since the first ferroelectric layer 24 exhibits extremely excellent insulating properties, as described later, by forming a specific second ferroelectric layer (PZTN layer) 26 on the first ferroelectric layer 24 (PZT layer), the ferroelectric capacitor 100 according to this embodiment exhibits excellent ferroelectric characteristics and piezoelectric characteristics.

Specifically, when heating the PZT layer, lead and oxygen tend to be released from the PZT layer, whereby deficiencies may occur. In particular, since oxygen atoms easily move in comparison with other elements, diffusion of oxygen atoms occurs due to oxygen deficiency. Moreover, Pb, Zr, and Ti of PZT become unstable due to the charge imbalance caused by oxygen deficiency, whereby the diffusion coefficients of these elements increase. On the other hand, crystal defects occur in the PZTN layer to only a small extent. In particular, since an oxygen deficiency can be prevented, diffusion of oxygen in the PZT layer can be suppressed. Therefore, PZT crystal defects due to heat treatment can be suppressed, whereby excellent insulating properties of PZT can be maintained.

The ferroelectric capacitor 100 according to this embodiment includes the oxide electrode 32 and the metal electrode 34 as the second electrode 30. Since the oxide electrode 32 contains oxygen, diffusion of oxygen from the second ferroelectric layer 26 can be prevented, whereby oxygen deficiency of the second ferroelectric layer 26 can be reduced. As a result, the fatigue characteristics and the imprint characteristics of the ferroelectric capacitor can be improved.

2. Method of Manufacturing Ferroelectric Capacitor

A method of manufacturing a ferroelectric capacitor according to one embodiment of the invention includes at least the following steps.

Specifically, the method includes forming the first electrode 22 above the substrate 20, forming the first ferroelectric layer 24 including a ferroelectric shown by $Pb(Zr,Ti)O_3$ above the first electrode 22 by CVD method, forming the second ferroelectric layer 26 including a ferroelectric shown by $Pb(Zr,Ti)_{1-x}Nb_xO_3$ above the first ferroelectric layer 24 by a solution method, and forming the second electrode 30 above the second ferroelectric layer 26.

The manufacturing method according to this embodiment is described below in detail with reference to FIG. 1.

(1) Formation of First Electrode 22

The first electrode 22 is formed on the substrate 20. The first electrode layer 22 includes at least one layer selected from a platinum layer, an iridium layer, and an iridium oxide layer. The first electrode 22 functions as a seed layer or a buffer layer for controlling the crystal orientation of the first ferroelectric layer 24. For example, when forming a (111)-oriented first ferroelectric layer 24, a platinum group element such as Pt, Ir, or Ru may be used as the material for the first electrode 22.

(2) Formation of First Ferroelectric Layer 24

The first ferroelectric layer 24 including $Pb(Zr,Ti)O_3$ is formed on the first electrode 22 by CVD method (preferably MOCVD method). Specifically, a raw material gas including an organometallic compound containing Pb, Zr, or Ti and an oxidizing gas are sprayed onto the heated substrate 20 (first electrode 22). The heating temperature (deposition temperature) may be 400 to 600° C., for example. This causes the organometallic compound to be thermally decomposed to form the first ferroelectric layer 24 including PZT on the first electrode 22. The first ferroelectric layer 24 is then heat-treated by rapid thermal annealing (RTA), for example. The heat treatment temperature is preferably higher than the deposition temperature. The PZT layer can be formed at a relatively low deposition temperature by forming the first ferroelectric layer 24 by MOCVD method. On the other hand, the first ferroelectric layer 24 exhibits poor surface morphology to some extent.

An ordinary organometallic compound may be used as the organometallic compound for depositing PZT. As examples of such an organometallic compound, the following compounds can be given.

Organometallic compounds containing Pb: $Pb(CH_3)_4$, $Pb(C_2H_5)_4$, $Pb(dpm)_2$ Organometallic compounds containing Ti: $TiCl_4$, $Ti(O-iC_3H_7)_4$, $Ti(O-tC_4H_9)_4$, $Ti(O-iC_3H_7)_2(dpm)_2$, $TiO(dpm)_2$, $TiO(dpm)_2$, $Ti[N(CH_3)_2]_4$ Organometallic compounds containing Zr: $ZrCl_4$, $Zr(O-iC_3H_7)_4$, $Zr(O-tC_4H_9)_4$, $Zr(dpm)_4$ Note that "dpm" indicates $(C(CH_3)_3)_2(CO)_2CH_2$.

The first ferroelectric layer 24 may be epitaxially grown on the first electrode 22, as described above. In this case, the first ferroelectric layer 24 is grown to have the same plane orientation as the first electrode 22. For example, when using platinum as the material for the first electrode 22, the first ferroelectric layer 24 has a (111) orientation.

(3) Formation of Second Ferroelectric Layer 26

The second ferroelectric layer 26 is formed by a solution method such as a sol-gel method or a metal organic deposition (MOD) method. In this embodiment, the second ferroelectric layer 26 may be formed by applying a specific precursor composition including a precursor for forming a ferroelectric shown by $Pb(Zr,Ti,Nb)O_3$ and heat-treating the applied precursor composition.

The precursor composition and a method of producing the same are described below in detail.

The precursor composition includes at least one of a thermally-decomposable organometallic compound containing Pb, Zr, Ti, or Nb, a hydrolyzable organometallic compound containing Pb, Zr, Ti, or Nb, and a partial hydrolyzate and/or a polycondensate thereof, at least one of a polycarboxylic acid and a polycarboxylic acid ester, and an organic solvent.

The precursor composition may be produced by mixing organometallic compounds respectively containing the constituent metal of the material which forms the complex metal oxide or a partial hydrolyzate and/or a polycondensate thereof so that the metals are contained at a desired molar ratio, and dissolving or dispersing the organometallic compounds in an organic solvent such as an alcohol. It is preferable to use organometallic compounds which are stable in a solution state.

An organometallic compound which can be used in this embodiment is an organometallic compound which can produce a metal oxide originating in the organometallic compound upon hydrolysis or oxidation. The organometallic compound is selected from an alkoxide, an organic metal complex, an organic acid salt, and the like of each metal.

As the thermally-decomposable organometallic compounds respectively containing the constituent metal of the complex metal oxide, organometallic compounds such as a metal alkoxide, an organic acid salt, and a beta-diketone complex may be used. As the hydrolyzable organometallic compounds respectively containing the constituent metal of the complex metal oxide, organometallic compounds such as a metal alkoxide may be used. As examples of the organometallic compounds, the following compounds can be given.

As examples of the organometallic compounds containing Pb, lead acetate and lead octylate can be given. As examples of the organometallic compounds containing Zr or Ti, an alkoxide, acetate, octylate, and the like of Zr or Ti can be given.

Figure 3:
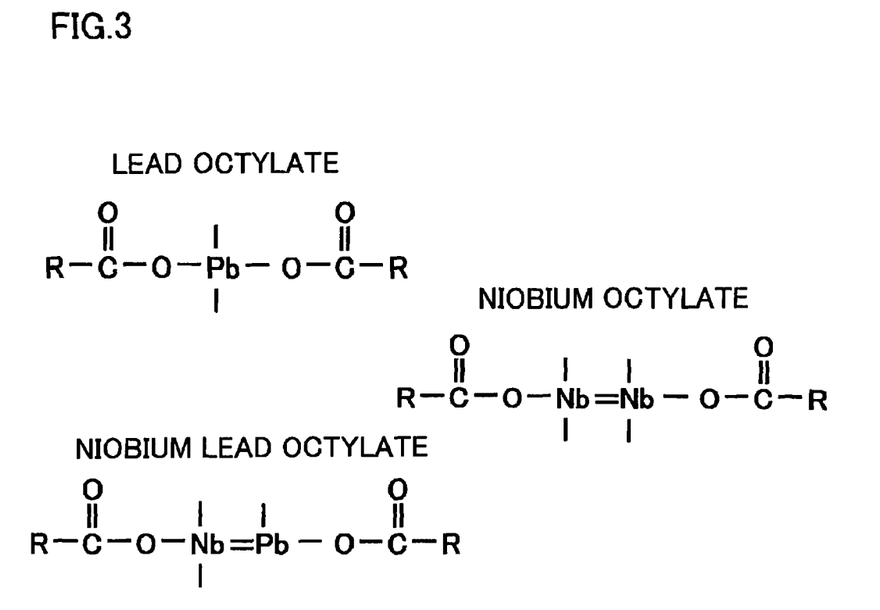
FIG. 3 shows lead-containing carboxylic acids used in one embodiment of the invention.
Figure 4A:
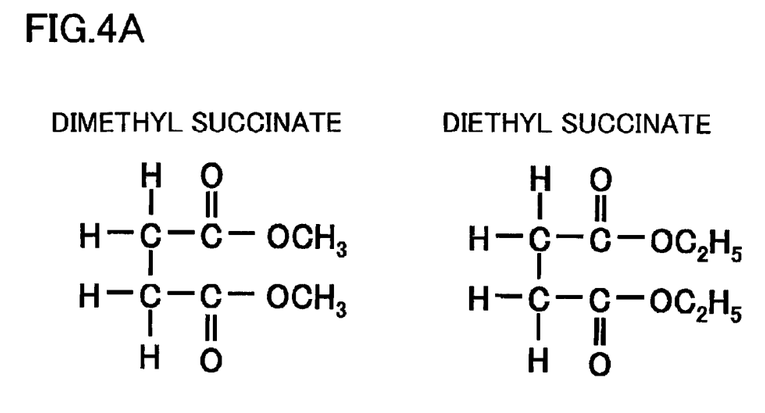
FIGS. 4A to 4D show polycarboxylic acids or polycarboxylic acid esters used in one embodiment of the invention.
Figure 4B:
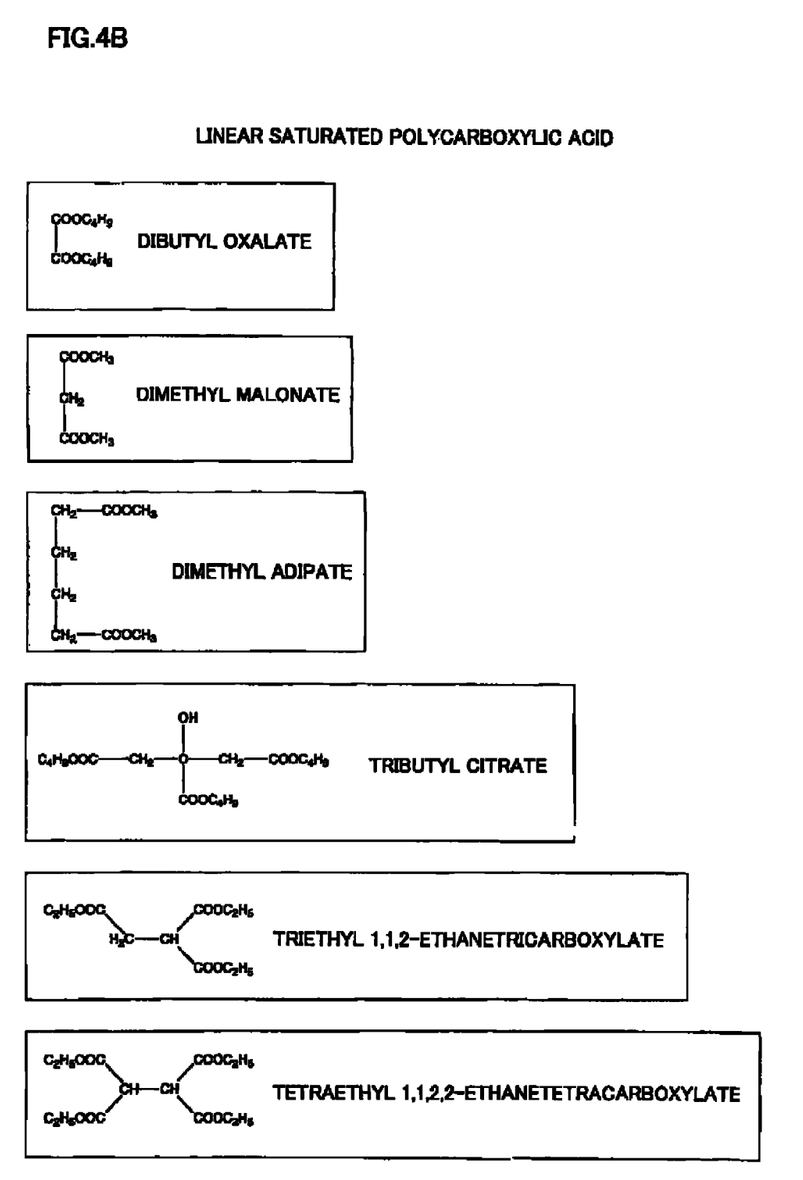
Figure 4C:
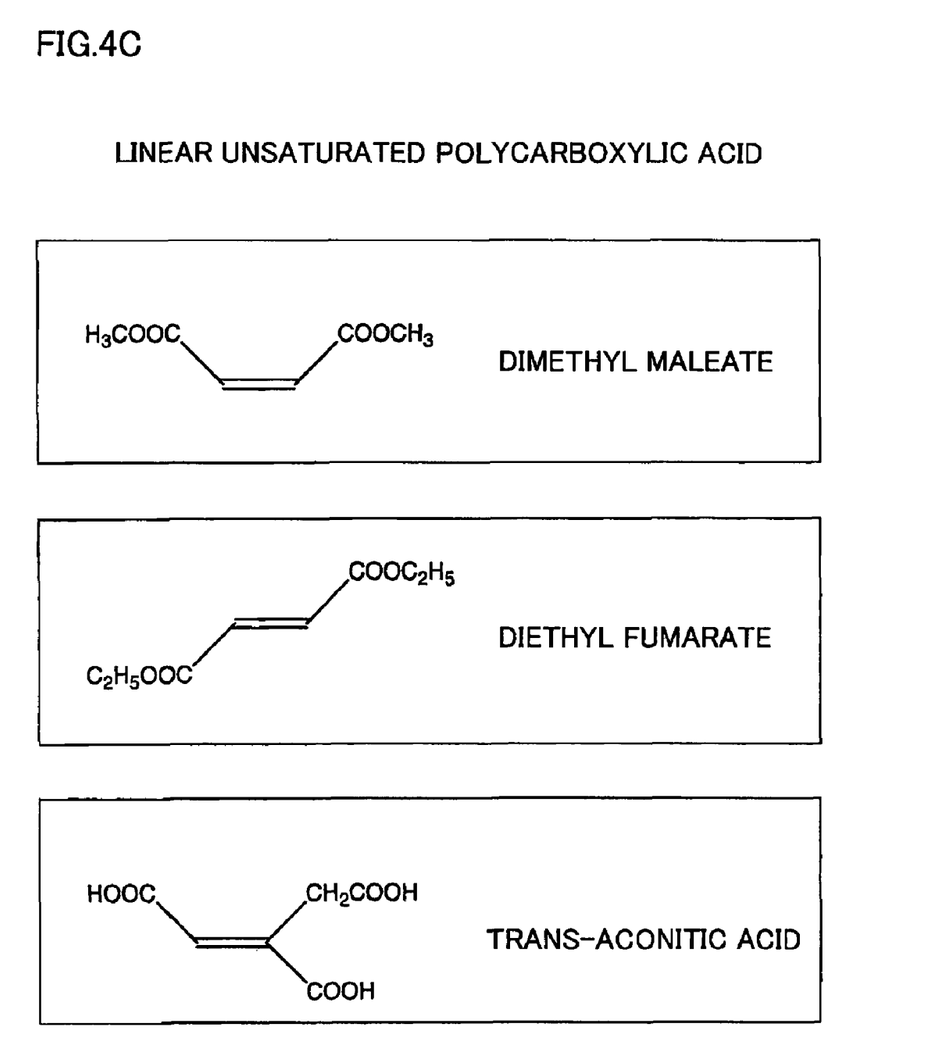
Figure 4D:
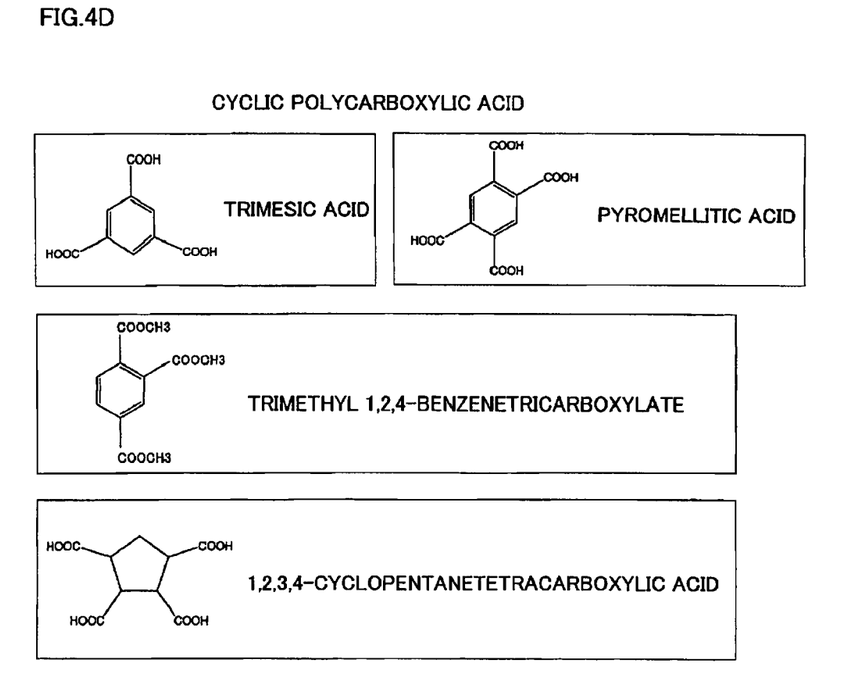

As examples of the organometallic compounds containing Nb, niobium octylate and niobium lead octylate can be given. As shown in FIG. 3, niobium octylate has a structure in which two Nb atoms are bonded via a covalent bond and octyl groups exist in the remaining portions.

In the raw material composition according to this embodiment, an alcohol may be used as the organic solvent. Use of an alcohol as the solvent allows the organometallic compounds and the polycarboxylic acid or the polycarboxylic acid ester to be advantageously dissolved. The alcohol is not particularly limited. Monohydric alcohols such as butanol, methanol, ethanol, and propanol, and polyhydric alcohols can be given as examples of the alcohol. As examples of such alcohols, the following compounds can be given.

Monohydric Alcohol:

Propanol (propyl alcohol): 1-propanol (boiling point: 97.4° C.) and 2-propanol (boiling point: 82.7° C.)

Butanol (butyl alcohol): 1-butanol (boiling point: 117° C.), 2-butanol (boiling point: 100° C.), 2-methyl-1-propanol (boiling point: 108° C.), and 2-methyl-2-propanol (melting point: 25.4° C., boiling point: 83° C.)

Pentanol (amyl alcohol): 1-pentanol (boiling point: 137° C.), 3-methyl-1-butanol (boiling point: 131° C.), 2-methyl-1-butanol (boiling point: 128° C.), 2,2-dimethyl-1-propanol (boiling point: 113° C.), 2-pentanol (boiling point: 119° C.), 3-methyl-2-butanol (boiling point: 112.5° C.), 3-pentanol (boiling point: 117° C.), and 2-methyl-2-butanol (boiling point: 102° C.)

Polyhydric Alcohol:

Ethylene glycol (melting point: −11.5° C., boiling point: 197.5° C.) and glycerol (melting point: 17° C., boiling point: 290° C.)

The polycarboxylic acid or the polycarboxylic acid ester used in the precursor composition may contain two or more carboxyl groups. As examples of the polycarboxylic acid used in the invention, the following compounds can be given. As examples of tricarboxylic acids, trans-aconitic acid, trimesic acid, and the like can be given. As examples of tetracarboxylic acids, pyromellitic acid, 1,2,3,4-cyclopentanetetracarboxylic acid, and the like can be given. As examples of the polycarboxylic acid ester, dicarboxylic acid esters such as dimethyl succinate, diethyl succinate, dibutyl oxalate, dimethyl malonate, dimethyl adipate, dimethyl maleate, and diethyl fumarate, tricarboxylic acid esters such as tributyl citrate and triethyl 1,1,2-ethanetricarboxylate, tetracarboxylic acid esters such as tetraethyl 1,1,2,2-ethanetetracarboxylate and trimethyl 1,2,4-benzenetricarboxylate, and the like can be given. FIGS. 4A to 4D show examples of the polycarboxylic acids or the polycarboxylic acid esters.

The dicarboxylic acid ester used in the precursor composition may be preferably at least one compound selected from a succinic acid ester, a maleic acid ester, and a malonic acid ester. As specific examples of these esters, dimethyl succinate, dimethyl maleate, and dimethyl malonate can be given.

The polycarboxylic acid or the polycarboxylic acid ester may have a boiling point higher than that of the organic solvent. If the polycarboxylic acid or the polycarboxylic acid ester has a boiling point higher than that of the organic solvent, the reaction of the raw material composition can proceed more promptly, as described later.

The polycarboxylic acid ester may have a molecular weight of 150 or less. If the molecular weight of the polycarboxylic acid ester is too high, a film may be easily damaged when the ester volatilizes during heat treatment, whereby a dense film may not be obtained.

The polycarboxylic acid ester may be liquid at room temperature. If the polycarboxylic acid ester is solid at room temperature, gelation may occur.

A complex metal oxide obtained by using the above precursor composition may include Nb in the range of preferably $0.05 \leq x \leq 1$, and still more preferably $0.1 \leq x \leq 0.3$. The complex metal oxide may include Si or Si and Ge in an amount of preferably 0.5 mol % or more, and still more preferably 0.5 mol % or more and 5 mol % or less. In this embodiment, the complex metal oxide may be $Pb(Zr,Ti,Nb)O_3$ (PZTN) in which the Ti site is doped with Nb.

Since the PZTN forming the second ferroelectric layer 26 according to this embodiment includes a specific amount of Nb, the second ferroelectric layer 26 exhibits excellent composition controllability due to the absence of the adverse effects of a Pb deficiency.

The amount of the polycarboxylic acid or the polycarboxylic acid ester used varies depending on the composition of the complex metal oxide. For example, the total molar ionic concentration of the metals for forming the complex metal oxide and the molar ionic concentration of the polycarboxylic acid (ester) may be preferably set at 1≧(molar ionic concentration of polycarboxylic acid (ester))/(total molar ionic concentration of metals in raw material solution).

The number of moles of the polycarboxylic acid or the polycarboxylic acid ester used herein refers to the number of carboxyl groups. Specifically, when using a dicarboxylic acid or a dicarboxylic acid ester, the ratio is 1:1 when the amount of dicarboxylic acid or dicarboxylic acid ester is 0.5 mol for 1 mol of metals in the raw material solution.

The second ferroelectric layer 26 is obtained by applying the above precursor composition to the first ferroelectric layer 24 and heat-treating the applied precursor composition.

In more detail, the precursor composition is applied to the substrate by spin coating or the like, and dried at 150 to 180° C. by using a hot plate or the like to remove the solvent. A cleaning heat treatment (which mainly decomposes and removes organic components) is then performed at 300 to 350° C. by using a hot plate or the like. The coating step, the drying step, and the cleaning heat treatment step are optionally performed a number of times to obtain a coating film with a desired thickness. The coating film is then subjected to crystallization annealing (firing) to form the second ferroelectric layer 26 with a desired thickness. The crystallization firing may be performed at 650 to 700° C. in an oxygen atmosphere by rapid thermal annealing (RTA) or the like.

(4) Formation of Second Electrode 30

The second electrode 30 is formed on the second ferroelectric layer 26. In the example shown in FIG. 1, the second electrode 30 may be formed by the following method, for example. Specifically, the oxide electrode 32 is formed of an iridium oxide layer on the second ferroelectric layer 26 by reactive sputtering, and the metal electrode 34 is formed of an iridium layer on the oxide electrode 32 by reactive sputtering. The second electrode 30 may be formed by sputtering, CVD, or the like.

(5) Formation of Capacitor

The first and second ferroelectric layers 24 and 26 and the second electrode 30 are patterned by lithography and etching.

A protective layer 30 may be formed of an oxide (silicon oxide), nitride (silicon nitride), alumina, or the like by an ordinary method (e.g. CVD) on the exposed surfaces of the substrate 20, the first electrode 22, the ferroelectric layers 24 and 26, and the second electrode layer 30, as required.

The manufacturing method according to this embodiment has the following effects by forming the second ferroelectric layer 26 on the first ferroelectric layer 24. Specifically, occurrence of crystal defects in the PZT layer can be suppressed and diffusion of atoms of the PZT layer can be prevented by forming the second ferroelectric layer (PZTN layer) 26 on the first ferroelectric layer (PZT layer) 24. This prevents deterioration in the insulating properties of the PZT layer, whereby the ferroelectric capacitor according to this embodiment exhibits excellent ferroelectric characteristics and piezoelectric characteristics.

The effects of the combination of the PZT layer 24 and the PZTN layer 26 are described below in detail.

In the ferroelectric layer, crystal defects tend to be concentrated at the uppermost portion of the ferroelectric layer. In particular, although PZT is suitable for device applications due to a low crystallization temperature of about 500° C., a lead deficiency tends to occur in the uppermost portion of the PZT layer due to the high vapor pressure of lead (Pb). When a lead deficiency has occurred, an oxygen deficiency also occurs according to the charge neutrality principle (Schottky defects). As a result, PZT shows a large leakage current. As described above, while it is relatively easy to obtain an excellent PZT crystal film at a low crystallization temperature, a large leakage current tends to occur due to the heterophase containing a lead deficiency and an oxygen deficiency occurring in the upper portion of the PZT layer. This makes it difficult to obtain a PZT layer with excellent retention characteristics such as fatigue characteristics and imprint characteristics.

On the other hand, PZTN is a ferroelectric which can prevent an oxygen deficiency, even if defects have occurred due to the high vapor pressure of lead, by utilizing the high covalent bonding properties of polyvalent niobium. As a result, PZTN shows a leakage current about 1/10,000th that of PZT. This has been confirmed by the inventor of the invention. On the other hand, PZTN tends to exhibit a crystallization temperature higher to some extent than that of PZT.

The invention combines the advantages of PZT and PZTN while compensating for the disadvantages of PZT and PZTN. For example, a PZT crystal layer with a large thickness (e.g. one micrometer) is initially formed. In this case, since PZT has a low crystallization temperature, an excellent crystal film is relatively easily obtained. A thin PZTN layer (e.g. 100 nm) is then formed on the uppermost layer. The PZTN layer can be crystallized at a low temperature through epitaxial growth by effectively utilizing the crystal orientation of PZT. Moreover, the PZTN layer absorbs the heterophase in the uppermost portion of the PZT layer during crystallization. Since the PZTN layer is a ceramic which rarely produces a heterophase, as described above, a heterophase rarely occurs in the uppermost portion of the laminate. As a result, the ferroelectric capacitor according to the invention exhibits excellent insulating properties and exhibits excellent ferroelectric characteristics and piezoelectric characteristics, as is clear from the following example.

3. Example

An example according to the invention is described below. Note that the invention is not limited to the following example.

3.1. Example 1

A ferroelectric capacitor according to Example 1 was obtained as follows. In Example 1, a PZT layer was used as a first ferroelectric layer, and a PZTN layer was used as a second ferroelectric layer. The reference numerals of the members are the same as those shown in FIG. 1.

(1) Formation of First Electrode and First Ferroelectric Layer

A Pt layer (first electrode) 22 with a thickness of 90 nm was formed on a silicon substrate 20. The Pt layer was formed by sputtering.

A PZT first ferroelectric layer (hereinafter may be called "PZT layer") 24 was formed on the first electrode 22 by MOCVD method. As organometallic compounds containing Pb, Zr, or Ti, $Pb(dpm)_2$, $Zr(dpm)_4$, and $Ti(O-iC_3H_7)_2(dpm)_2$ were used. After vaporizing a solution containing these organometallic compounds, the resulting gas was introduced into a reaction chamber together with oxygen gas. The raw material gas was sprayed onto the substrate 20 (first electrode 22) set at a temperature of 600° C. through a shower head to form a PZT layer. The thickness of the PZT layer was about 1 micrometer. The composition ratio of PZT was $Pb(Zr_{0.45}Ti_{0.55})O_3$.

(2) Formation of Second Ferroelectric Layer

A precursor composition was prepared, and a PZTN second ferroelectric layer (hereinafter may be called "PZTN layer") 26 was formed by using the precursor composition. The precursor composition used in this step was obtained as follows.

Specifically, the PZTN film precursor composition was obtained by mixing first to third raw material solutions respectively containing at least one of Pb, Zr, Ti, and Nb, dimethyl succinate as a polycarboxylic acid ester, and n-butanol as an organic solvent. The mixed solution was prepared by dissolving the sol-gel raw material and dimethyl succinate in n-butanol at a ratio of 1:1.

As the first raw material solution, a solution was used in which a polycondensation product for forming a $PbZrO_3$ perovskite crystal containing Pb and Zr was dissolved in n-butanol in an anhydrous state.

As the second raw material solution, a solution was used in which a polycondensation product for forming a $PbTiO_3$ perovskite crystal containing Pb and Ti was dissolved in n-butanol in an anhydrous state.

As the third raw material solution, a solution was used in which a polycondensation product for forming a $PbNbO_3$ perovskite crystal containing Pb and Nb was dissolved in n-butanol in an anhydrous state.

When forming a $PbZr_{0.33}Ti_{0.47}Nb_{0.2}O_3$ (PZTN) ferroelectric layer by using the first, second, and third raw material solutions, the raw material solutions are mixed at a ratio of "(first raw material solution):(second raw material solution):(third raw material solution)=33:47:20". In order to reduce the crystallization temperature of the ferroelectric layer, a solution prepared by dissolving a polycondensation product for forming a $PbSiO_3$ crystal in n-butanol in an anhydrous state was added to the above mixed solution as a fourth raw material solution in an amount of 2 mol % to obtain a precursor composition.

The resulting precursor composition was applied to the first ferroelectric layer 24 by spin coating. The resulting coating film was dried at 150 to 180° C. and subjected to cleaning heat treatment at 300 to 350° C. The coating film was fired at 700° C. by RTA to obtain a PZTN layer with a thickness of about 100 nm.

(3) Formation of Upper Electrode and Protective Layer

An $IrO_2$ layer (oxide electrode) 32 with a thickness of 60 nm and an Ir layer (metal electrode) 34 with a thickness of 50 nm were formed in that order on the second ferroelectric layer (PZTN layer) 26 by sputtering. The metal electrode 34, the oxide electrode 32, the second ferroelectric layer 26, and the first ferroelectric layer 24 were patterned by lithography and dry etching to form a capacitor. A protective layer (silicon oxide layer) 32 was then formed by CVD method using trimethylsilane.

Figure 5A:
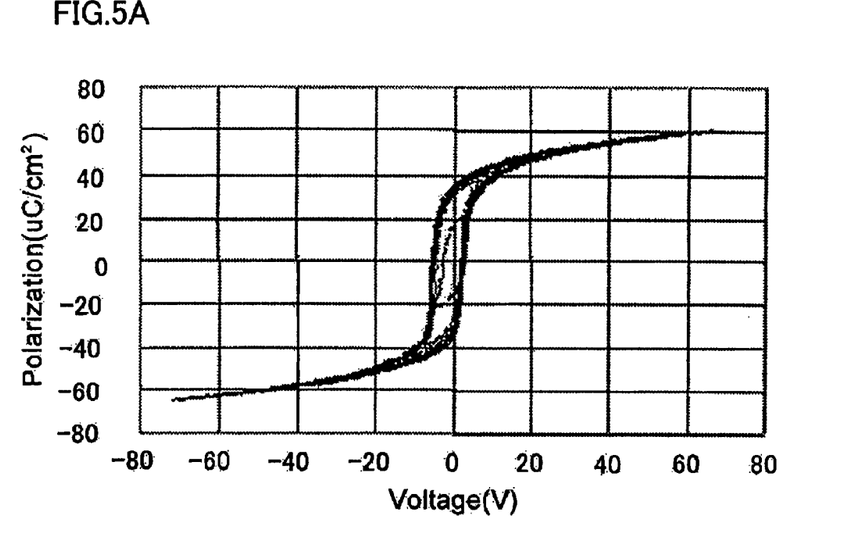
FIG. 5A shows the hysteresis characteristics of a ferroelectric memory of Example 1.

The hysteresis characteristics of the capacitor of Example 1 thus obtained were determined. The results are shown in FIG. 5A. The symbol a in FIG. 6 indicates the relationship between the voltage and polarization (2Pr) determined for the capacitor of Example 1.

Figure 6:
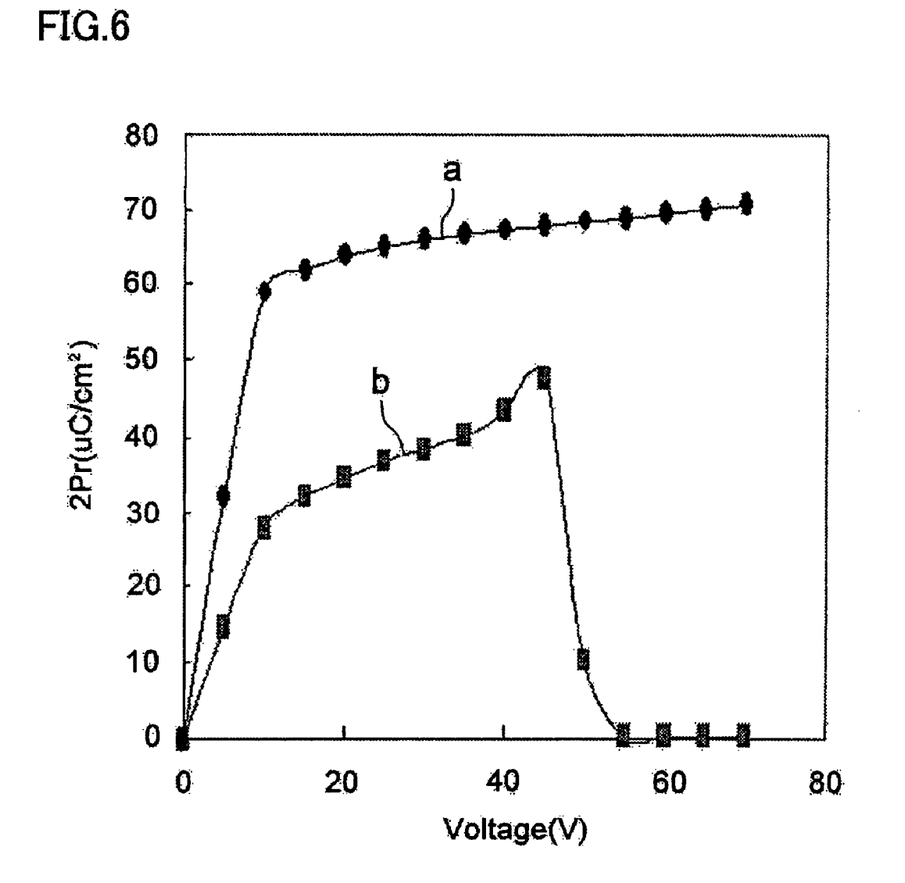
FIG. 6 shows changes in polarization in Example 1 and Comparative Example 1.

As shown in FIG. 5A, it was confirmed that the capacitor of Example 1 exhibits excellent ferroelectric characteristics and excellent hysteresis characteristics. As shown in FIG. 6, it was confirmed that the capacitor of Example 1 exhibits a stable and large polarization over a wide voltage range.

3.2. Comparative Example 1

Figure 5B:
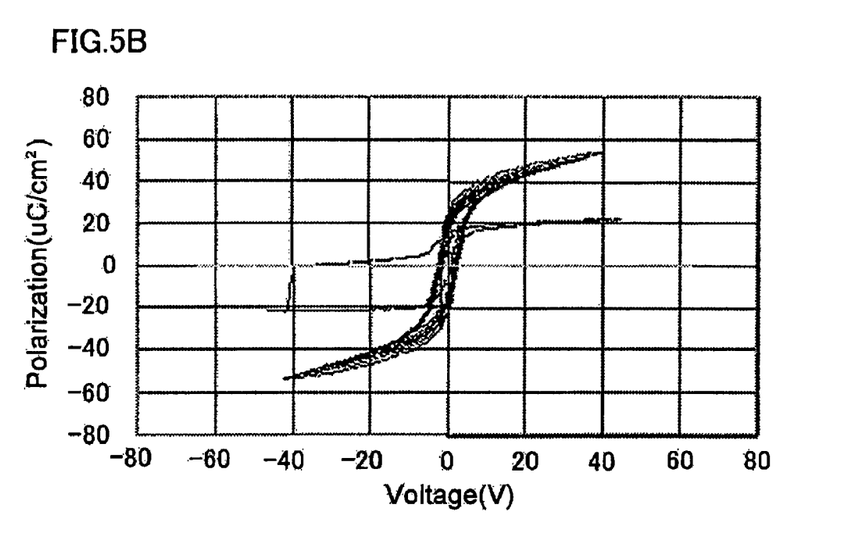
FIG. 5B shows the hysteresis characteristics of a ferroelectric memory of Comparative Example 1.

A comparative capacitor was obtained in the same manner as in Example 1 except that the second ferroelectric layer 26 was not formed. The hysteresis characteristics of the comparative capacitor were determined to obtain the results shown in FIG. 5B. As shown in FIG. 5B, it was confirmed that the comparative capacitor does not exhibit hysteresis characteristics at a specific voltage.

The symbol b in FIG. 6 indicates the relationship between the voltage and polarization (2Pr) determined for the comparative capacitor of Comparative Example 1. As shown in FIG. 6, it was confirmed that the capacitor of Comparative Example 1 shows a small polarization in comparison with the capacitor of Example 1. It was also confirmed that the capacitor of Comparative Example 1 breaks at a voltage higher than about 50 V to lose ferroelectric characteristics.

As described above, it was confirmed that the capacitor of Example 1 including the PZTN layer provided on the PZT layer exhibits extremely excellent insulating properties and excellent ferroelectric characteristics in comparison with the capacitor of Comparative Example 1 which does not include the PZTN layer. The remanent polarization of Example 1 was about twice that of Comparative Example 1. Since the remanent polarization is proportional to the piezoelectric constant, a large piezoelectric constant which is about twice that of Comparative Example 1 is obtained according to Example 1.

4. Ferroelectric Memory 4.1. First Ferroelectric Memory

A ferroelectric memory including the ferroelectric capacitor is described below.

Figure 7:
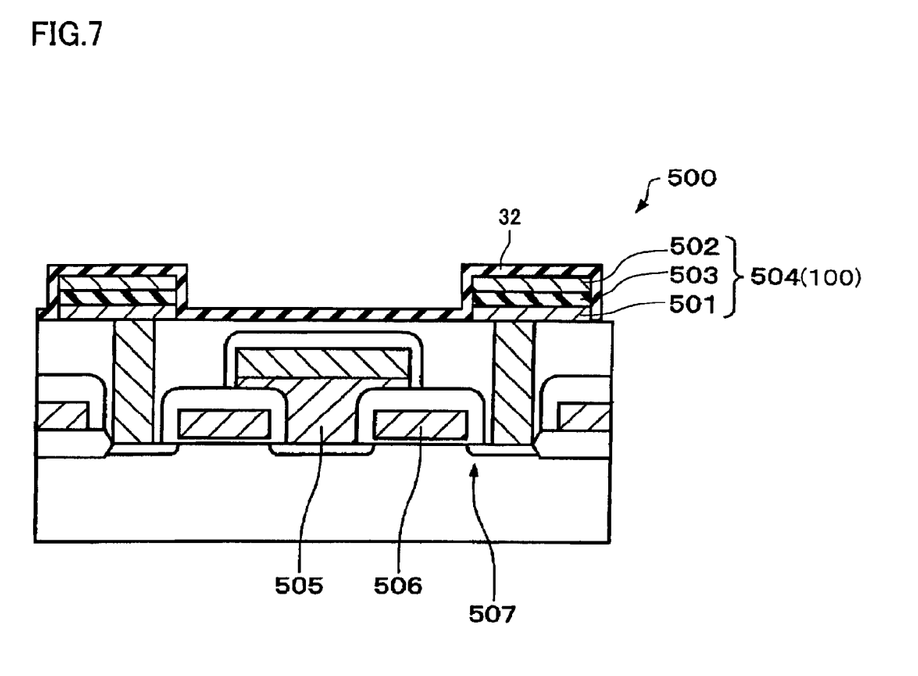
FIG. 7 is a cross-sectional view schematically showing a 1T1C ferroelectric memory according to one embodiment of the invention.
Figure 8:
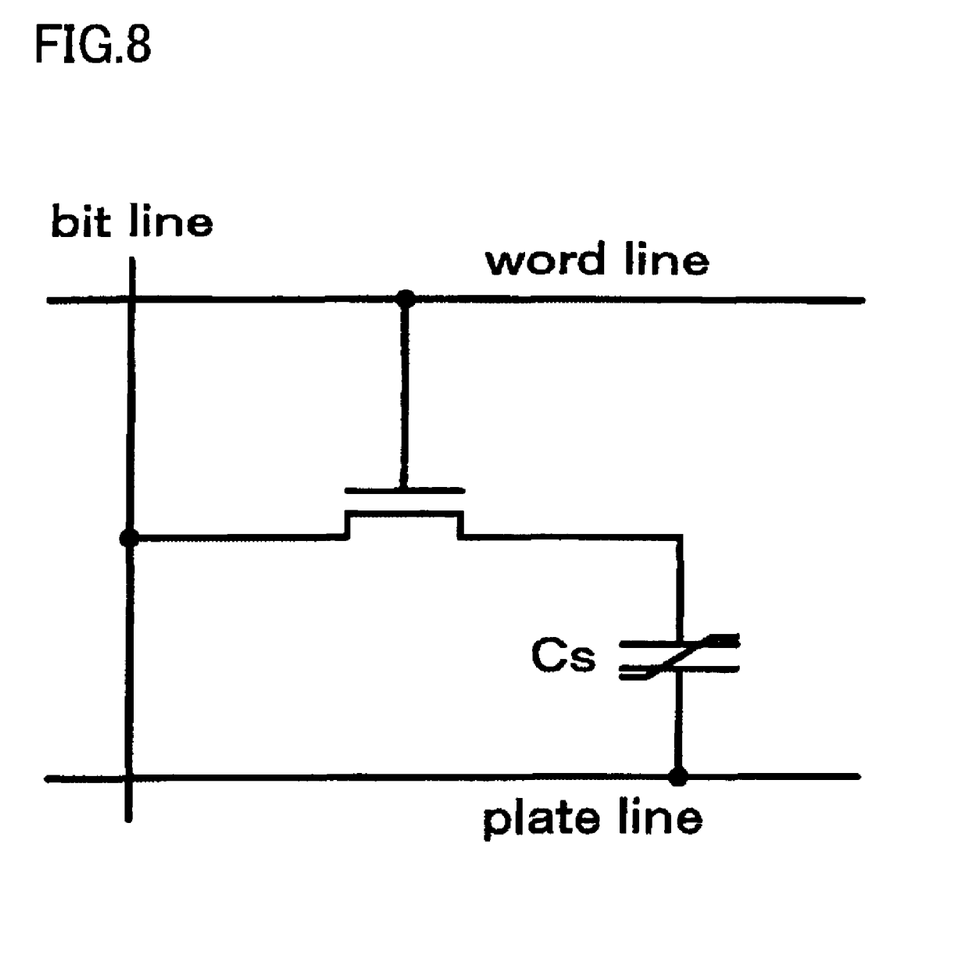
FIG. 8 is an equivalent circuit diagram of the ferroelectric memory shown in FIG. 7.

FIG. 7 is a structural view of a 1T1C ferroelectric memory 500 including the above ferroelectric capacitor. FIG. 8 is an equivalent circuit diagram of the ferroelectric memory 500.

As shown in FIG. 7, the ferroelectric memory 500 is a memory device having a structure similar to that of a DRAM, and includes a capacitor 504 (corresponding to the ferroelectric capacitor 100 shown in FIG. 1) including a lower electrode 501 (corresponding to the first electrode 22 shown in FIG. 1), an upper electrode 502 (corresponding to the second electrode 30 shown in FIG. 1) connected with a plate line, and a ferroelectric layer 503 (corresponding to the first and second ferroelectric layers 24 and 26 shown in FIG. 1), and a switching transistor element 507 including source/drain electrodes, one of which is connected with a data line 505, and a gate electrode 506 connected with a wordline. In FIG. 7, a reference numeral 32 corresponds to the protective layer 32 shown in FIG. 1. In the 1T1C ferroelectric memory, data can be written and read at a speed as high as 100 ns or less, and the written data does not volatilize. Therefore, the 1T1C ferroelectric memory is a promising memory which may replace an SRAM and the like.

Since the ferroelectric memory according to this embodiment is formed by using the ferroelectric capacitor according to the above embodiment, the ferroelectric memory according to this embodiment shows a small leakage current and exhibits excellent fatigue characteristics and imprint characteristics. The ferroelectric memory according to this embodiment is not limited to the above 1T1C ferroelectric memory, but may be applied to a 2T2C ferroelectric memory and the like.

4.2. Second Ferroelectric Memory

Figure 9A:
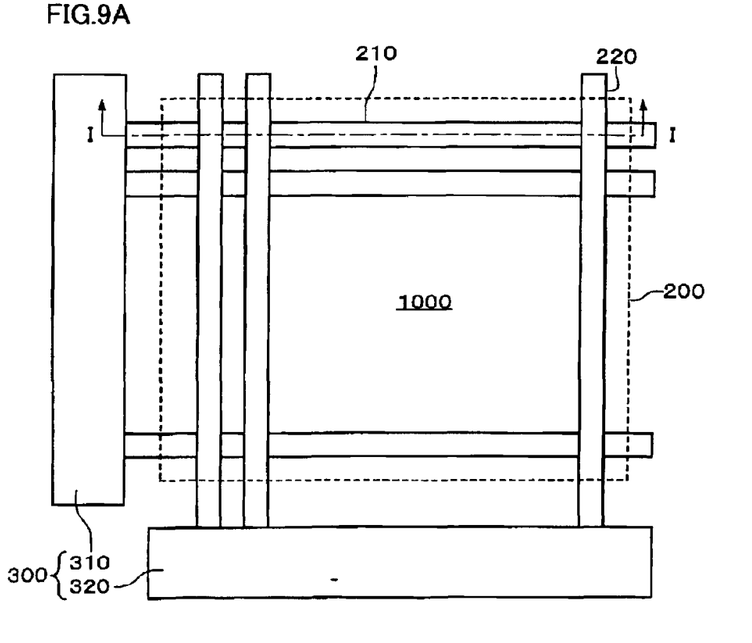
FIGS. 9A and 9B show a ferroelectric memory according to one embodiment of the invention.
Figure 9B:
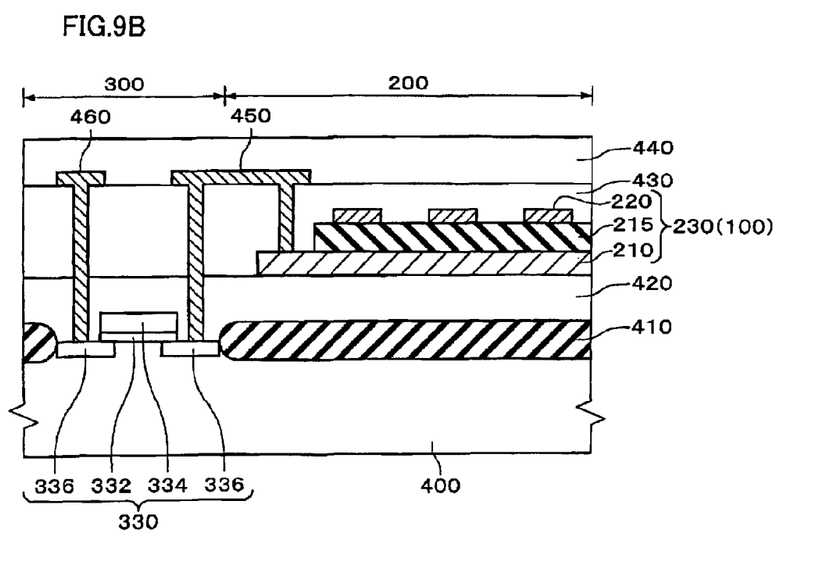

FIGS. 9A and 9B are views schematically showing a ferroelectric memory 1000 including the above ferroelectric capacitor. FIG. 9A shows the planar shape of the ferroelectric memory 1000, and FIG. 9B shows the cross section along the line I-I in FIG. 9A.

As shown in FIG. 9A, the ferroelectric memory 1000 includes a memory cell array 200 and a peripheral circuit section 300. In the memory cell array 200, row-selection lower electrodes 210 (corresponding to the first electrode 22 shown in FIG. 1) and column-selection upper electrodes 220 (corresponding to the second electrode 30 shown in FIG. 1) are arranged to intersect. The lower electrodes 210 and the upper electrodes 220 are formed in the shape of stripes formed of linear signal electrodes. The signal electrodes may be formed so that the lower electrode 210 serves as a bitline and the upper electrode 220 serves as a wordline. The peripheral circuit section 300 includes various circuits for selectively writing or reading information into or from the memory cell array 200. For example, the peripheral circuit section 300 includes a first driver circuit 310 for selectively controlling the lower electrode 210, a second driver circuit 320 for selectively controlling the upper electrode 220, and a signal detection circuit (not shown) such as a sense amplifier.

As shown in FIG. 9B, a ferroelectric layer 215 (corresponding to the ferroelectric layers 24 and 26 shown in FIG. 1) is disposed between the lower electrodes 210 and the upper electrodes 220. In the memory cell array 200, a memory cell functioning as a ferroelectric capacitor 230 (corresponding to the ferroelectric capacitor 100 shown in FIG. 1) is formed in a region in which the lower electrode 210 intersects the upper electrode 220. The ferroelectric capacitor 230 is formed of the above ferroelectric capacitor 100. It suffices that the ferroelectric film 215 be disposed at least in the region in which the lower electrode 210 intersects the upper electrode 220.

As shown in FIG. 9B, the peripheral circuit section 300 includes a MOS transistor 330 formed on a semiconductor substrate 400. The MOS transistor 330 includes a gate insulating film 332, a gate electrode 334, and source/drain regions 336. The MOS transistors 330 are isolated by an element isolation region 410. A first interlayer dielectric 420 is formed on the semiconductor substrate 400 on which the MOS transistor 330 is formed. The peripheral circuit section 300 is electrically connected with the memory cell array 200 through an interconnect layer 51. A second interlayer dielectric 430 and an insulating protective layer 440 are formed in the ferroelectric memory 1000.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

What is claimed is:

1. A ferroelectric capacitor comprising:
   a substrate;
   a first electrode formed above the substrate;
   a first ferroelectric layer formed above the first electrode and including a complex oxide shown by $Pb(Zr,Ti)O_3$;
   a second ferroelectric layer formed above the first ferroelectric layer and including a complex oxide shown by $Pb(Zr,Ti)_{1-x}Nb_xO_3$ ($0.1 \leqq x \leqq 0.3$), silicon in the second ferroelectric layer forming part of a crystal as an A-site; and
   a second electrode formed above the second ferroelectric layer.

2. The ferroelectric capacitor as defined in claim 1, wherein the second ferroelectric layer includes between 0.5 mol % or more and 10 mol % or less of Si.

3. The ferroelectric capacitor as defined in claim 1, wherein the thickness of the second ferroelectric layer is smaller than the thickness of the first ferroelectric layer.

4. The ferroelectric capacitor as defined in claim 1, wherein the second electrode includes an iridium oxide layer formed on the second ferroelectric layer and an iridium layer formed on the iridium oxide layer.

5. The ferroelectric capacitor as defined in claim 1, wherein the first electrode includes at least one layer selected from a platinum layer, an iridium layer, and an iridium oxide layer.

6. A ferroelectric memory comprising the ferroelectric capacitor as defined in claim 1.

7. The ferroelectric capacitor as defined in claim 1, wherein the second ferroelectric layer is an epitaxial layer.

8. A ferroelectric capacitor comprising:
   a substrate;
   a first electrode formed above the substrate;
   a first ferroelectric layer formed above the first electrode and including lead zirconate titanate;
   a second ferroelectric layer formed above the first ferroelectric layer and including lead zirconate titanate niobate, silicon in the second ferroelectric layer forming part of a crystal as an A-site; and
   a second electrode formed above the second ferroelectric layer.

9. A ferroelectric capacitor comprising:
   a substrate;
   a first electrode disposed on the substrate;
   a lead zirconate titanate layer disposed on the first electrode;
   a lead zirconate titanate niobate layer disposed on the lead zirconate titanate layer; and
   a second electrode disposed on the lead zirconate titanate niobate layer,
   the lead zirconate titanate niobate layer including a plurality of unit cells of perovskite crystal structure,
   the lead zirconate titanate niobate layer including a plurality of silicon atoms,
   one of the plurality of silicon atoms existing at one of a plurality of A-sites of the plurality of unit cells.

10. The ferroelectric capacitor as defined in claim 9, the lead zirconate titanate niobate layer including the plurality of silicon atoms from 0.5 mol% to 10 mol%.

* * * * *